(12) United States Patent
Kim et al.

(10) Patent No.: US 10,706,776 B2
(45) Date of Patent: Jul. 7, 2020

(54) ORGANIC LIGHT-EMITTING DISPLAY DEVICE

(71) Applicant: Samsung Display Co., Ltd., Yongin-si (KR)

(72) Inventors: Yong Jae Kim, Seoul (KR); Jin Jeon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/102,728

(22) Filed: Aug. 14, 2018

(65) Prior Publication Data

US 2019/0147799 A1 May 16, 2019

(30) Foreign Application Priority Data

Nov. 14, 2017 (KR) .......................... 10-2017-0151496

(51) Int. Cl.
*G09G 3/3233* (2016.01)
*H01L 27/32* (2006.01)
(Continued)

(52) U.S. Cl.
CPC ............ *G09G 3/3233* (2013.01); *G09G 3/20* (2013.01); *G09G 3/3266* (2013.01); *G09G 3/3291* (2013.01); *H01L 27/124* (2013.01); *H01L 27/1225* (2013.01); *H01L 27/3246* (2013.01); *H01L 27/3276* (2013.01); *H01L 51/5218* (2013.01); *H01L 51/5234* (2013.01); *G09G 2300/043* (2013.01); *G09G 2300/0819* (2013.01); *G09G 2310/08* (2013.01)

(58) Field of Classification Search
CPC ...... G09G 3/3233; G09G 3/3266; G09G 3/20; G09G 3/3291; G09G 2300/043; G09G 2300/0819; G09G 2310/08; H01L 27/3246; H01L 27/124; H01L 27/1225; H01L 27/3276; H01L 51/5218; H01L 51/5234
See application file for complete search history.

(56) References Cited

U.S. PATENT DOCUMENTS 8,531,099 B2  9/2013  Koh
2010/0182223 A1  7/2010  Choi et al.
(Continued)

FOREIGN PATENT DOCUMENTS

KR  10-1048965  7/2011
KR  10-1717232  3/2017
(Continued)

*Primary Examiner* — Jimmy H Nguyen
(74) *Attorney, Agent, or Firm* — H. C. Park & Associates, PLC (57) ABSTRACT

An organic light-emitting display device including a plurality of pixels. Each of the pixels includes an organic light-emitting diode (OLED), a driving transistor, which has a control electrode connected to a first node, an input electrode connected to a second node, and an output electrode connected to the third node and provides a driving current to the OLED in accordance with a voltage of the control electrode, a sustain capacitor, which is connected to the first node, a first transistor, which controls whether the first and third nodes are to be connected, and a compensation transistor, which has both an input electrode and an output electrode connected to the first node.

20 Claims, 6 Drawing Sheets

(51) Int. Cl.
*H01L 27/12* (2006.01)
*G09G 3/3266* (2016.01)
*H01L 51/52* (2006.01)
*G09G 3/3291* (2016.01)
*G09G 3/20* (2006.01)

(56) References Cited

U.S. PATENT DOCUMENTS

| | | | | |
|---|---|---|---|---|
| 2014/0240368 | A1* | 8/2014 | Koh | G09G 3/3258 |
| | | | | 345/690 |
| 2016/0379562 | A1* | 12/2016 | Yoon | G09G 3/3233 |
| | | | | 345/215 |
| 2017/0148383 | A1 | 5/2017 | Kim | |
| 2018/0286307 | A1* | 10/2018 | Kim | G09G 3/3233 |
| 2018/0293939 | A1 | 10/2018 | Kim et al. | |

FOREIGN PATENT DOCUMENTS

| | | |
|---|---|---|
| KR | 10-2017-0060214 | 6/2017 |
| KR | 10-2018-0114981 | 10/2018 |

* cited by examiner

ORGANIC LIGHT-EMITTING DISPLAY DEVICE

CROSS REFERENCE TO RELATED APPLICATION

This application claims priority from and the benefit of Korean Patent Application No. 10-2017-0151496, filed on Nov. 14, 2017, which is hereby incorporated by reference for all purposes as if fully set forth herein.

BACKGROUND

Field

Exemplary embodiments of the inventive concepts relate to an organic light-emitting display device.

Discussion of the Background

An organic light-emitting display device, which is a next-generation display device having self-emission properties, has many desirable viewing features, such as a wide viewing angle, high contrast, fast response speed, and low power consumption, as compared to a liquid crystal display (LCD) device.

Each pixel of the organic light-emitting display device, which displays an image, includes an organic light-emitting diode (OLED), which has an anode electrode, an organic thin film layer, and a cathode electrode, and a plurality of thin film transistors (TFTs), which are for controlling the OLED.

In general, a TFT, which is used in an active matrix configuration, includes an active layer, which provides a channel region, a source region, and a drain region, and a gate electrode, which is formed on the channel region and is electrically insulated from the active layer by a gate insulating film.

The active layer of the TFT is generally formed as a semiconductor layer using amorphous silicon or polysilicon.

However, if the active layer of the TFT is formed of amorphous silicon, it may be difficult to realize a driving circuit that operates at high speed because of low mobility.

On the other hand, polysilicon has high mobility. However, due to the polycrystalline nature of polysilicon, the threshold voltage of the TFT may become irregular, and as a result, a compensation circuit is needed to compensate for the dispersion of the threshold voltage and the mobility of the TFT. If the active layer of the TFT is formed of polysilicon, the yield of the TFT decreases because the TFT requires a complicated compensation circuit consisting of multiple TFTs and capacitors. Also, due to a coplanar structure, the number of masks required increases, as compared to the case of using amorphous silicon to form the active layer of the TFT, and as a result, the manufacturing cost of the TFT increases.

In the meantime, a conventional method of forming a TFT using low-temperature polysilicon (LTPS) is difficult to apply to a large-scale substrate because it involves several expensive processes, such as laser thermal treatment, and therefore, makes it difficult to control the characteristics of the TFT.

In order to address these problems, an oxide semiconductor may be used as an active layer.

An oxide semiconductor having zinc oxide (ZnO) as its main ingredient is considered as amorphous and stable, and if the oxide semiconductor is used as an active layer, a TFT can be fabricated using existing manufacturing equipment, even at a low temperature of 350° C. or lower, without the need to purchase additional equipment, and an ion injection process can be omitted.

However, the characteristics of a TFT having an oxide semiconductor as its active layer may vastly differ depending on the structure of the TFT, and as a result, the development of a TFT having an oxide semiconductor as its active layer is generally limited to an N-type transistor.

An oxide semiconductor has been applied to a TFT having an inverted staggered bottom gate structure in consideration of the characteristics and the uniformity of a device, but the field effect mobility of a TFT using an oxide semiconductor is undesirably as low as 20 $cm^2$/Vs. Accordingly, when applied to a display panel, a TFT using an oxide semiconductor produces a lower integration density than a TFT using amorphous silicon or polysilicon.

A TFT structure capable of offering both the benefits of an amorphous silicon semiconductor, a polysilicon semiconductor, and a LTPS semiconductor and the benefits of an oxide semiconductor is required. Thus, a structure in which some TFTs included in each pixel comprise amorphous silicon, polysilicon, or LTPS and other TFTs include an oxide semiconductor has been suggested.

However, if a TFT using an oxide semiconductor as its active layer is implemented as an N-type transistor, the voltages of the source and drain electrodes of the TFT may drop as the TFT is turned off. In other words, a voltage drop caused by a kickback may occur. If a kickback-induced voltage drop occurs at the gate electrode of the driving transistor of each pixel, the display quality of an organic light-emitting display device may be adversely affected.

The above information disclosed in this Background section is only for understanding of the background of the inventive concepts, and, therefore, it may contain information that does not constitute prior art.

SUMMARY

Exemplary embodiments of the inventive concepts provide an organic light-emitting display device capable of minimizing a decrease in display quality that may be caused by a kickback-induced voltage drop.

Additional features of the inventive concepts will be set forth in the description which follows, and in part will be apparent from the description, or may be learned by practice of the inventive concepts.

An exemplary embodiment of the inventive concepts provides an organic light-emitting display device including a plurality of pixels, wherein each of the pixels includes an organic light-emitting diode (OLED), a driving transistor, which has a control electrode connected to a first node, an input electrode connected to a second node, and an output electrode connected to the third node and provides a driving current to the OLED in accordance with a voltage of the control electrode, a sustain capacitor, which is connected to the first node, a first transistor, which controls whether the first and third nodes are to be connected, and a compensation transistor, which has both an input electrode and an output electrode connected to the first node.

An exemplary embodiment of the inventive concepts also discloses an organic light-emitting display device including: a substrate on which a plurality of pixels are defined; a first semiconductor layer disposed on the substrate; a second semiconductor layer disposed on the first semiconductor layer; and an OLED disposed on the semiconductor layer and provided in each of the pixels. An active layer of a driving transistor, which provides a driving current to the OLED, is the first semiconductor layer, an active layer of a first transistor, which is connected to an output electrode and a control electrode of the driving transistor, is the second semiconductor layer, and an active layer of a compensation transistor, which has both an input electrode and an output electrode connected to a control electrode of the driving transistor, is the second semiconductor layer.

According to the aforementioned and other exemplary embodiments of the inventive concepts, an organic light-emitting display device capable of minimizing a decrease in display quality that may be caused by a kickback-induced voltage drop can be provided.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

Figure 1:
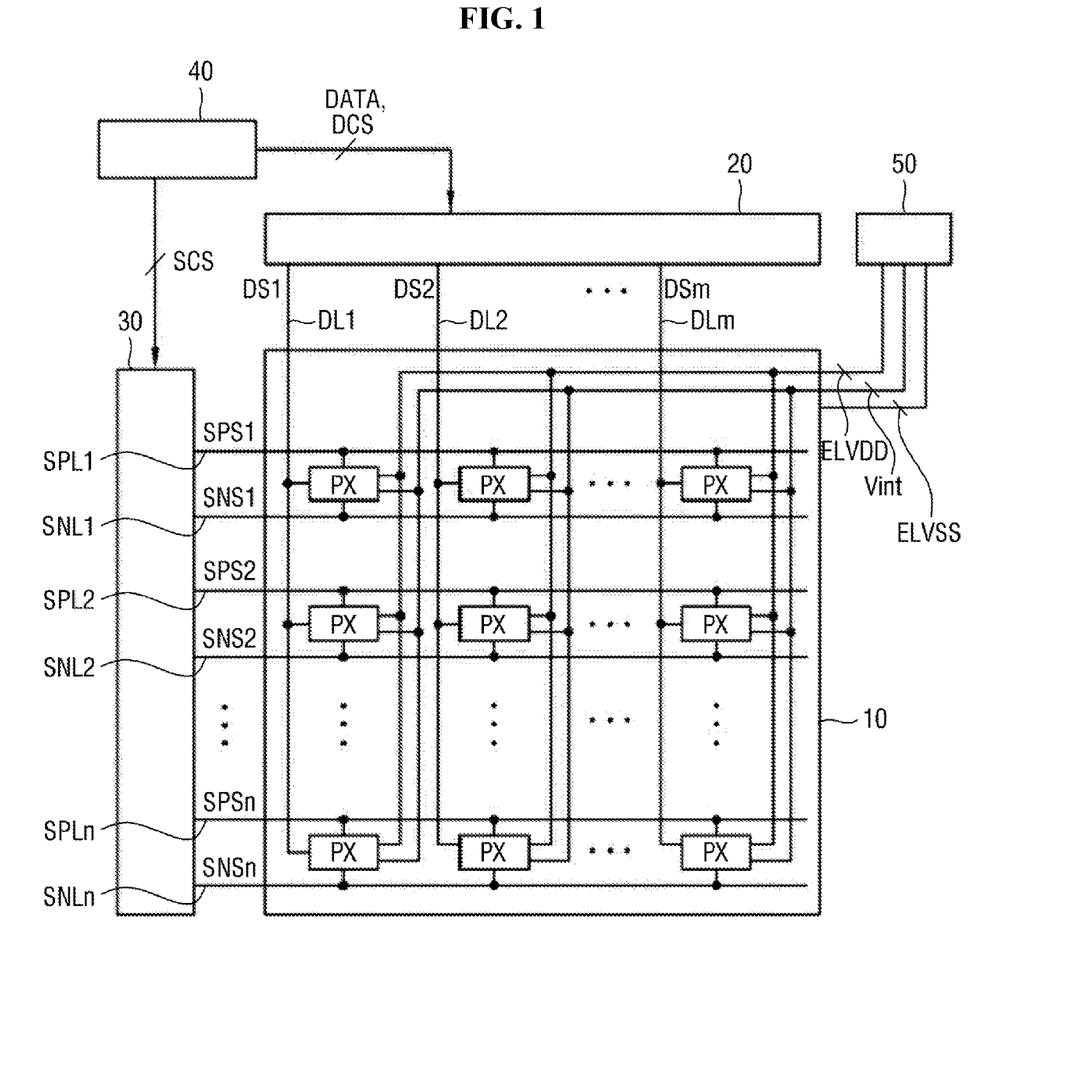
FIG. 1 is a block diagram of an organic light-emitting display device according to an exemplary embodiment of the inventive concepts.

FIG. 1 is a block diagram of an organic light-emitting display device according to an exemplary embodiment of the inventive concepts.

Referring to FIG. 1, the organic light-emitting display device according to an exemplary embodiment includes a display unit 10, a data driving unit 20, a scan driving unit 30, a timing control unit 40, and a power supply unit 50.

In the display unit 10, a plurality of pixels PX are arranged in a matrix. Also, in the display unit 10, data lines DL1 through DLm (where m is a natural number of 2 or greater), which extend in one direction, and scan lines SPL1 through SPLn and inverted scan lines SNL1 through SNLn (where n is a natural number of 2 or greater), which intersect the data lines DL1 through DLm, are disposed.

Alternatively, in the display unit 10, emission lines (not illustrated), which control the emission of light by each of the pixels PX, may be disposed in parallel to the scan lines SPL1 through SPLn and the inverted scan lines SNL1 through SNLn. Also, in the display unit 10, additional lines may be further disposed in addition to the scan lines SPL1 through SPLn, the inverted scan lines SNL1 through SNLn, and the emission lines. For example, initialization lines (not illustrated), which are for initializing a particular node in each of the pixels PX, may be further disposed. Also, various control lines for collecting and writing data for use in threshold voltage compensation for preventing any smudges caused by differences in characteristics between the pixels PX from becoming visible and for use in the compensation of any degradation in a fluorescent organic compound so as to prevent smudges from becoming visible may be further disposed.

The data driving unit 20 includes a plurality of source driver integrated circuits (ICs). The data driving unit 20 may receive digital video data DATA from the timing control unit 40. The data driving unit 20 may generate data signals by converting the digital video data DATA into gamma compensation voltages in response to a source timing control signal DCS provided thereto by the timing control unit 40 and may provide the generated data signals to the data lines DL1 through DLm so as for the generated data signals to be synchronized with scan signals.

The scan driving unit 30 includes a circuit generating and outputting scan signals and inverted scan signals and a circuit generating and outputting emission signals. Each of the circuits of the scan driving unit 30 may include a shift register, a level shifter, and an output buffer. The scan driving unit 30 may sequentially provide the scan signals to the scan lines SPL1 through SPLn and may sequentially provide the inverted scan signals to the inverted scan lines SNL1 through SNLn.

In a case where additional lines are provided in the display unit 10 in parallel with the scan lines SPL1 through SPLn, the scan driving unit 30 may further include at least one output circuit for outputting signals to the additional lines.

The timing control unit 40 receives the digital video data DATA from a host system (not illustrated) via an interface such as a low-voltage differential signaling (LVDS) interface or a transition-minimized differential signaling (TMDS) interface. Also, the timing control unit 40 receives timing signals, such as a vertical synchronization signal, a horizontal synchronization signal, a data enable signal, and a dot clock. The timing control unit 40 may generate timing control signals for controlling the operation timings of the data driving unit 20 and the scan driving unit 30 based on the timing signals. The timing control signals include a scan timing control signal SCS for controlling the operation timing of the scan driving unit 30 and a data timing control signal DCS for controlling the operation timing of the data driving unit 20. The timing control unit 40 may provide the scan timing control signal SCS to the scan driving unit 30 and may provide the data timing control signal DCS to the data driving unit 20.

The power supply unit 50 may provide a first power supply voltage ELVSS, a second power supply voltage ELVDD, and an initialization voltage Vint to each of the pixels PX. In the description that follows, it is assumed that the first power supply voltage ELVSS is a low-potential voltage, the second power supply voltage ELVDD is a high-potential voltage, and the initialization voltage Vint is an intermediate-potential voltage.

The power supply unit 50 may provide logic level voltages to the timing control unit 40 and may provide a gate-on voltage and a gate-off voltage to the scan driving unit 30.

The structure of the pixels PX will hereinafter be described.

Figure 2:
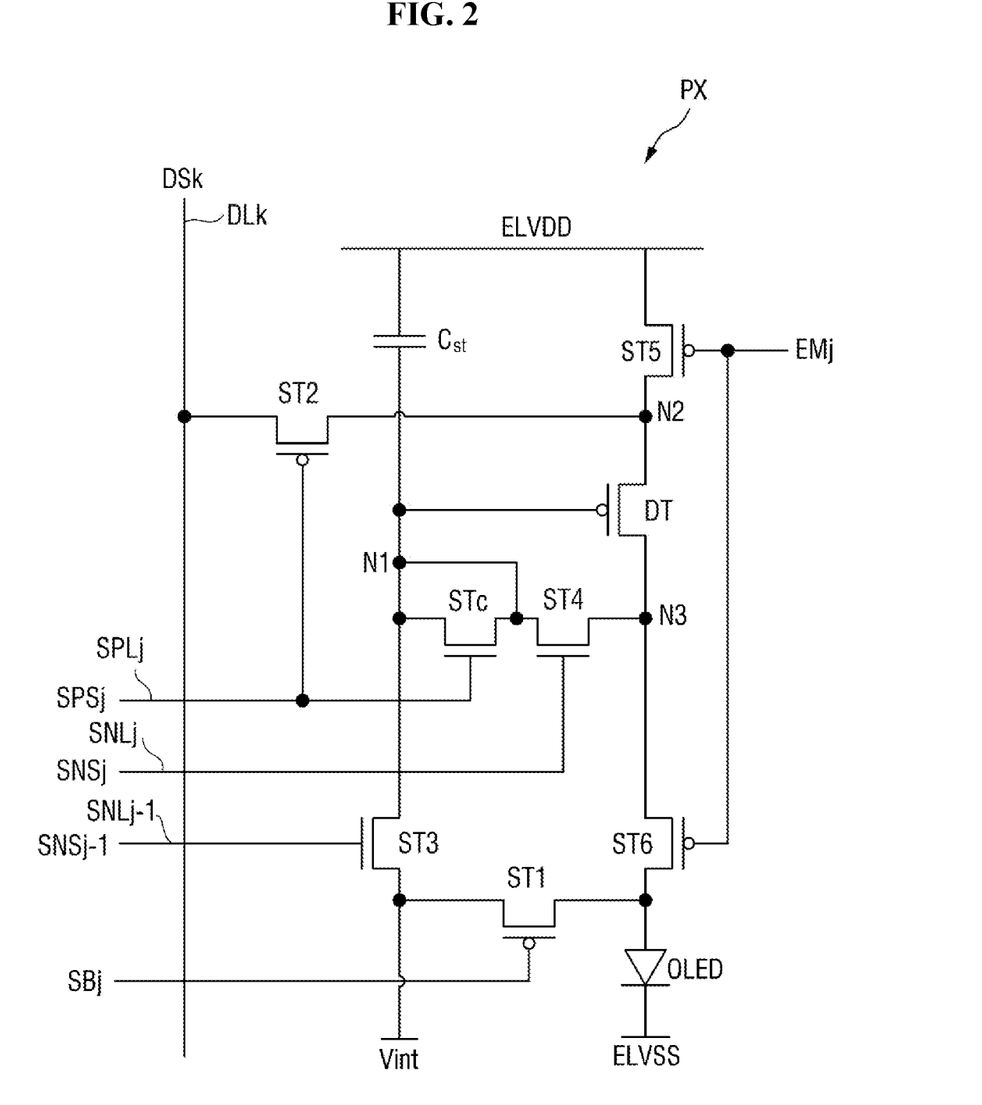
FIG. 2 is an equivalent circuit diagram of a pixel according to an exemplary embodiment of the inventive concepts.

FIG. 2 is an equivalent circuit diagram of a pixel according to an exemplary embodiment of the inventive concepts.

Referring to FIG. 2, a pixel PX includes a driving transistor DT, an organic light-emitting diode (OLED) "OLED", a control circuit, and a capacitor C. The control circuit includes first through sixth transistors ST1 through ST6 and a compensation transistor STc.

The pixel PX may be connected to a (j)-th scan line SPLj (where j is a positive integer satisfying 2≤j≤n+1), a j-th inverted scan line SNLj, a (j−1)-th inverted scan line SNLj−1, a j-th emission line EMLj, and a k-th data line DLk. Accordingly, the pixel PX may receive a j-th scan signal SPSj, a j-th inverted scan signal SNSj, a (j−1)-th inverted scan signal SNSj−1, and a k-th data signal DSk.

The pixel PX may also receive a j-th initialization signal SBj, a j-th emission signal EMj, the first power supply voltage ELVSS, the second power supply voltage ELVDD, and the initialization voltage Vint. The j-th initialization signal SBj may control the initialization of an anode electrode of the OLED "OLED", and the j-th emission signal EMj may control the emission of light by the OLED "OLED".

The driving transistor DT may control a source-drain current in accordance with the voltage of a control electrode thereof. The control electrode of the driving transistor DT is connected to a first node N1, a first electrode of the driving transistor DT is connected to a second node N2, and a second electrode of the driving transistor DT is connected to a third node N3. Here, the control electrode of the driving transistor DT may be a gate electrode, the first electrode of the driving transistor DT may be a source electrode or a drain electrode, and the second electrode of the driving transistor DT is an electrode different from the first electrode of the driving transistor DT. For example, if the first electrode of the driving transistor DT is the source electrode, the second electrode of the driving transistor DT may be the drain electrode.

The OLED "OLED" emits light in accordance with the source-drain current of the driving transistor DT. The anode electrode of the OLED "OLED" is connected to a first electrode of the first transistor ST1 and a second electrode of the sixth transistor ST6, and a cathode electrode of the OLED "OLED" may be provided with the first power supply voltage ELVSS.

The driving transistor DT may be a P-type transistor.

The first transistor ST1 is connected to the anode electrode of the OLED "OLED". The first transistor ST1 may be turned on by the j-th initialization signal SBj and may thus provide the initialization voltage Vint to the anode electrode of the OLED "OLED". As a result, the anode electrode of the OLED "OLED" may be discharged to as low as the initialization voltage Vint. Here, a control electrode of the first transistor ST1 may receive the j-th initialization signal SBj, and the first electrode of the first transistor ST1 may be connected to the anode electrode of the OLED "OLED".

The first transistor ST1 may be an N-type transistor.

The second transistor ST2 is connected between the second node N2 and the k-th data line DLk. The second transistor ST2 may be turned on by the j-th scan signal SPSj from the j-th scan line SPLj and may thus connect the second node N2 and the k-th data line DLk. As a result, the k-th data signal DSk from the k-th data line DLk may be provided to the second node N2. A control electrode of the second transistor ST2 may be connected to the j-th scan line SPLj, a first electrode of the second transistor ST2 may be connected to the k-th data line DLk, and a second electrode of the second transistor ST2 may be connected to the second node N2.

The second transistor ST2 may be a P-type transistor.

The third transistor ST3 is connected between the first node N1 and a line to which the initialization voltage Vint is provided. The third transistor ST3 may be turned on by the (j−1)-th inverted scan signal SNSj−1 from the (j−1)-th inverted scan line SNLj−1 and may thus provide the initialization voltage Vint to the first node N1. As a result, the first node N1 may be initialized to as low as the initialization voltage Vint. A control electrode of the third transistor ST3 may be connected to the (j−1)-th inverted scan line SNLj−1, a first electrode of the third transistor ST3 may be connected to the first node N1, and a second electrode of the third transistor ST3 may be connected to the line to which the initialization voltage Vint is provided.

The third transistor ST3 may be an N-type transistor.

The fourth transistor ST4 is connected between the first node N1 and the third node N3. The fourth transistor ST4 may be turned on by the j-th inverted scan signal SNSj from the j-th inverted scan line SNLj and may thus connect the first node N1 and the third node N3. In this case, since the gate electrode and the second electrode of the driving transistor DT are connected, the driving transistor DT may operate as a diode. A gate electrode of the fourth transistor ST4 may be connected to the j-th inverted scan line SNLj, a first electrode of the fourth transistor ST4 may be connected to the third node N3, and a second electrode of the fourth transistor ST4 may be connected to the first node N1.

The fourth transistor ST4 may be an N-type transistor.

The fifth transistor ST5 may be connected between a line to which the second power supply voltage ELVDD is provided and the second node N2. The fifth transistor ST5 may be turned on by the j-th emission signal EMj and may thus provide the second power supply voltage ELVDD to the second node N2.

The fifth transistor ST5 may be a P-type transistor.

The sixth transistor ST6 is connected between the third node N3 and the anode electrode of the OLED "OLED". A control electrode of the sixth transistor ST6 may be connected to a line that provides the j-th emission signal EMj. Accordingly, the sixth transistor ST6 may be turned on by the j-th emission signal EMj and may thus connect the third node N3 and the anode electrode of the OLED "OLED". A first electrode of the sixth transistor ST6 may be connected to the third node N3, and a second electrode of the sixth transistor ST6 may be connected to the anode electrode of the OLED "OLED. As the fifth and sixth transistors ST5 and S6 are turned on, the source-drain current of the driving transistor DT may be provided to the OLED "OLED".

The sixth transistor ST6 may be a P-type transistor.

A first electrode of the compensation transistor STc is connected to the first node N1, and a second electrode of the compensation transistor STc is connected to the first node N1 and the second electrode of the third transistor ST3. In other words, the source and drain electrodes of the compensation transistor STc may both be connected to the first node N1, and one of the source and drain electrodes of the compensation transistor STc may also be connected to the second electrode of the fourth transistor ST4. Accordingly, the first and second electrodes of the compensation transistor STc may be connected to each other and may thus have the same voltage level, regardless of a voltage provided to the control electrode of the compensation transistor STc.

Even though the first and second electrodes of the compensation transistor STc have the same voltage level, the control electrode of the compensation transistor STc may be connected to the j-th scan line SPLj and may thus be provided with the j-th scan signal SPSj. The j-th scan signal SPSj, which controls the turning on or off of the compensation transistor STc, may have a phase opposite to the j-th inverted scan signal SNSj, which is provided to the control electrode of the fourth transistor ST4 that is adjacent to the compensation transistor STc. Accordingly, in response to the compensation transistor STc being switched from an on state to an off state, the fourth transistor ST4 may be switched from an off state to an on state. On the other hand, in response to the compensation transistor STc being switched from an off state to an on state, the fourth transistor ST4 may be switched from an on state to an off state.

The compensation transistor STc and the fourth transistor ST4 are turned off and on, respectively, or turned on and off, respectively, at the same timing and can thus minimize each other's kickback voltage. Particularly, the fourth transistor ST4 is an N-type transistor. Thus, in a case where the fourth transistor ST4 is switched from an on state to an off state, the voltage level at the first node N1 may drop because of a kickback of the fourth transistor ST4. However, since the compensation transistor STc is also an N-type transistor, the drop in the voltage level at the first node N1, caused by the kickback of the fourth transistor ST4, can be minimized because in response to the fourth transistor ST4 being switched from an on state to an off state, the compensation transistor STc is switched from an off state to an on state.

Specifically, as the fourth transistor ST4 is turned off, electrons included in the active layer of the fourth transistor ST4 are released and introduced into the first node N1, thereby raising the voltage level at the first node N1. However, in a case where the compensation transistor STc is connected to the first node N1, electrons provided to the first node N1 by the kickback of the fourth transistor ST4 may be introduced into the active layer of the compensation transistor STc, and as a result, the drop in the voltage level at the first node N1 can be minimized. Particularly, in a case where the active layers of the fourth transistor ST4 and the compensation transistor STc are integrally formed, the drop in the voltage level at the first node N1, caused by the kickback of the fourth transistor ST4, can be further minimized. This will be described later in further detail.

The compensation transistor STc may be an N-type transistor.

A sustain capacitor Cst is connected between the first node N1 and a line to which the second power supply voltage ELVDD is provided and sustains the voltage at the first node N1

The first node N1 is connected to the control electrode of the driving transistor DT. The first node N1 may be a contact between the first electrode of the third transistor ST3, the second electrode of the fourth transistor ST4, the first and second electrodes of the compensation transistor STc, and a first electrode of the sustain capacitor Cst.

The third node N3 is connected to the second electrode of the driving transistor DT. The third node N3 may be a contact between the second electrode of the driving transistor DT, the first electrode of the fourth transistor ST4, and the first electrode of the sixth transistor ST6.

The first power supply voltage ELVSS, the second power supply voltage ELVDD, and the initialization voltage Vint may be set in consideration of the characteristics of the driving transistor DT and the characteristics of the OLED "OLED".

The driving transistor DT, the first transistor ST1, the second transistor ST2, the fifth transistor ST5, and the sixth transistor ST6 may be P-type transistors, and the third transistor ST3, the fourth transistor ST4, and the compensation transistor STc may be N-type transistors.

The active layers of the driving transistor DT, the first transistor ST1, the second transistor ST2, the fifth transistor ST5, and the sixth transistor ST6, which may all be P-type transistors, may be formed of at least one selected from among amorphous silicon, polysilicon, and low-temperature polysilicon (LTPS). On the other hand, the active layers of the third transistor ST3, the fourth transistor ST4, and the compensation transistor STc, which may all be N-type transistors, may be formed of an oxide semiconductor.

The types of the transistors of the pixel PX, however, are not particularly limited. That is, modifications can be made to the design of the pixel PX. However, even if the design of the pixel PX is changed, the driving transistor DT may still be a P-type transistor, and the fourth transistor ST4 may still be an N-type transistor. Only if the fourth transistor ST4 is an N-type transistor, a voltage drop may occur due to the kickback of the first and second electrodes of the fourth transistor ST4, and a transistor whose source-drain current is considerably influenced by such a voltage drop may be a P-type transistor. Specifically, in a case where the driving transistor DT is a P-type transistor, the first node N1, which is the control electrode of the driving transistor DT, needs to be maintained at a high voltage in order to minimize the source-drain current of the driving transistor DT to realize a black image, but a problem arises in that the kickback of the fourth transistor ST4, which is an N-type transistor, lowers the voltage at the first node N1.

Figure 3:
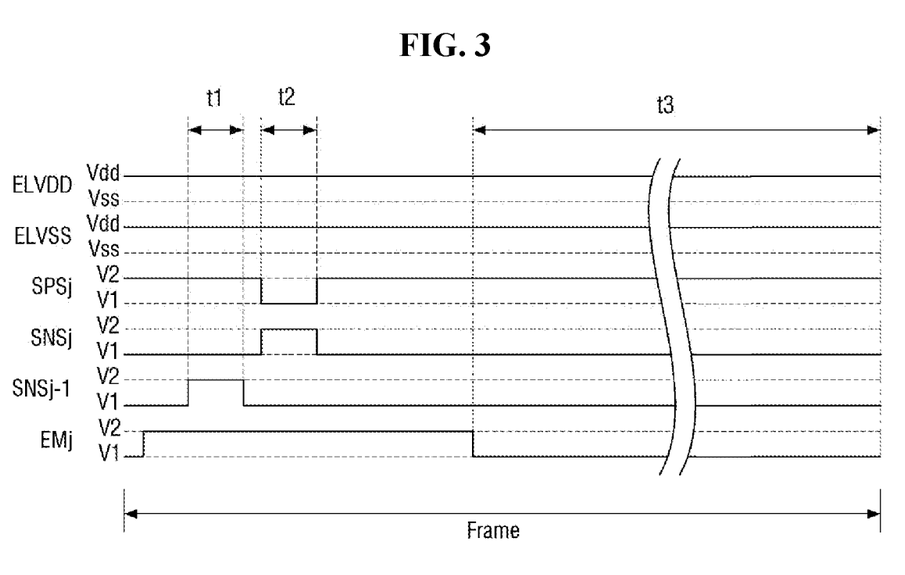
FIG. 3 is a timing diagram showing some signals input to the pixel according to an exemplary embodiment of the inventive concepts.

FIG. 3 is a timing diagram showing some signals input to the pixel according to an exemplary embodiment of the present disclosure.

Specifically, FIG. 3 shows the voltage levels and the waveforms of the first power supply voltage ELVSS, the second power supply voltage ELVDD, the j-th scan signal SPSj, the j-th inverted scan signal SNSj, the (j−1)-th inverted scan signal SNSj−1, and the j-th emission signal EMj during an arbitrary frame.

The j-th scan signal SPSj may be a signal for controlling the second transistor ST2 and the compensation transistor STc, the j-th inverted scan signal SNSj may be a signal for controlling the fourth transistor ST4, the (j−1)-th inverted scan signal SNSj−1 may be a signal for controlling the third transistor ST3, and the j-th emission signal EMj may be a signal for controlling the fifth transistor ST5 and the sixth transistor ST6.

Referring to FIG. 3, the j-th scan signal SPSj, the j-th inverted scan signal SNSj, the (j−1)-th inverted scan signal SNSj−1, and the j-th emission signal EMj may be signals that repeat themselves at intervals of one frame period.

The j-th scan signal SPSj may be maintained at a first voltage level V1 during one horizontal period. As used herein, the term "one horizontal period" may denote one horizontal line scanning period during which the data signals DS1 through DSm are applied to the pixels PX connected to any one of the scan lines SPL1 through SPLn. The data signals DS1 through DSm may be applied to the pixels PX in synchronization with the scan signals SPS1 through SPSn.

One frame period may include first, second, and third periods t1, t2, and t3.

The first period t1 may be a period during which the first node N1 connected to the control electrode of the driving transistor DT is initialized, an on bias is applied to the driving transistor DT, and the anode electrode of the OLED "OLED" is initialized. For this, the j-th scan signal SPSj may be maintained at a second voltage level V2, the j-th inverted scan signal SNSj may be maintained at the first voltage level V1, the (j−1)-th inverted scan signal SNSj−1 may be maintained at the second voltage level V2, and the j-th emission signal EMj may be maintained at the second voltage level V2.

The second period t2 may be a period during which the k-th data signal DSk is applied and the threshold voltage of the driving transistor DT is sensed. For this, the j-th scan signal SPSj may be maintained at the first voltage level V1, the j-th inverted scan signal SNSj may be maintained at the second voltage level V2, the (j−1)-th inverted scan signal SNSj−1 may be maintained at the first voltage level V1, and the j-th emission signal EMj may be maintained at the second voltage level V2.

The third period t3 may be a period during which the OLED "OLED" emits light. For this, the j-th scan signal SPSj may be maintained at the first voltage level V1, the j-th inverted scan signal SNSj may be maintained at the first voltage level V1, the (j−1)-th inverted scan signal SNSj−1 may be maintained at the second voltage level V2, and the j-th emission signal EMj may be maintained at the first voltage level V1.

Here, the first and second voltage levels V1 and V2 may correspond to output voltages of the scan driving unit 30. In a case where a transistor that is provided with voltages corresponding to the first and second voltage levels V1 and V2 is a P-type transistor, the first voltage level V1 may operate as a voltage level for turning on a TFT, and the second voltage level V2 may operate a voltage level for turning off a TFT. On the other hand, in a case where the transistor that is provided with the voltages corresponding to the first and second voltage levels V1 and V2 is an N-type transistor, the first voltage level V1 may operate as the voltage level for turning off a TFT, and the second voltage level V2 may operate as the voltage level for turning on a TFT.

It will hereinafter be described how the compensation transistor STc prevents a voltage drop at the first node N1.

Figure 4:
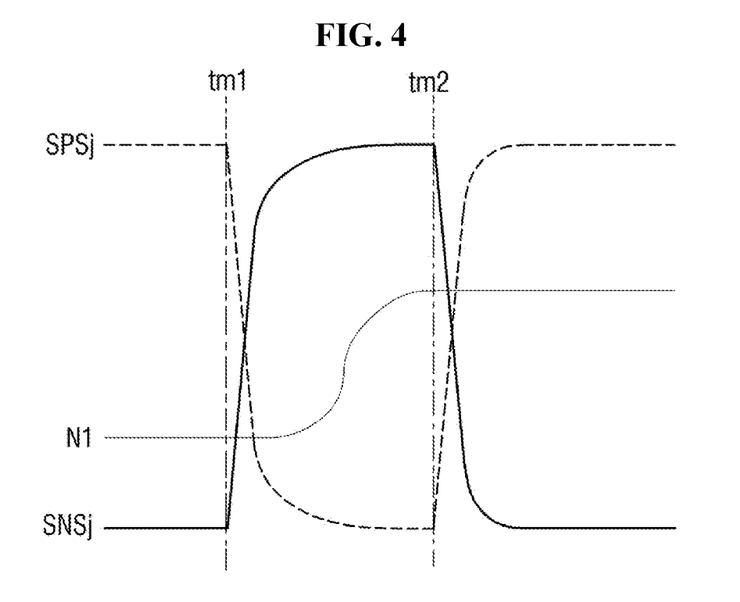
FIG. 4 is a graph showing some signals input to the pixel and the voltage level at a first node of the pixel according to an exemplary embodiment of the inventive concepts.

FIG. 4 is a graph showing some signals input to the pixel and the voltage level at a first node of the pixel according to an exemplary embodiment of the inventive concepts.

Specifically, FIG. 4 shows part of the frame illustrated in FIG. 3 when the j-th scan signal SPSj is switched from the second voltage level V2 to the first voltage level V1 and is switched back to the second voltage level V2, i.e., the second period t2.

Referring to FIG. 4, the j-th scan signal SPSj and the j-th inverted scan signal SNSj have opposite phases. Thus, at a first time tm1, the j-th scan signal SPSj is switched from the second voltage level V2 to the first voltage level V1, and at the same time, the j-th inverted scan signal SNSj is switched from the first voltage level V1 to the second voltage level V2.

Accordingly, the k-th data signal DSk provided to the pixel PX of FIG. 2 is transmitted to the first node N1 via the second transistor ST2, the driving transistor DT, and the fourth transistor ST4, and as a result, the voltage level at the first node N1 increases.

Then, at a second time tm2, the j-th scan signal SPSj is switched from the first voltage level V1 to the second voltage level V2, and at the same time, the j-th inverted scan signal SNSj is switched from the second voltage level V2 to the first voltage level V1.

Accordingly, the second transistor ST2, the driving transistor DT, and the fourth transistor ST4 are turned off. When the fourth transistor ST4 is turned off, electrons included in the active layer of the fourth transistor ST4 are introduced into the first node N1, and as a result, the voltage level at the first node N1 may undesirably decrease. In the pixel of FIG. 2, the compensation transistor STc is connected to the first node N1, and as the fourth transistor ST4 is turned off, the compensation transistor STc is turned on. Thus, the electrons included in the active layer of the fourth transistor ST4 move to the active layer of the compensation transistor STc. As a result, a voltage drop at the first node N1 can be minimized, and the deterioration of display quality that may be caused by a voltage drop at the first node N1 can be minimized. Also, since a margin for which the second power supply voltage ELVDD is required for a voltage drop at the first node N1 can be minimized, the level of the second power supply voltage ELVDD can be minimized, and the power consumption of the organic light-emitting display device according to an exemplary embodiment of the present disclosure can be minimized.

The structure of the organic light-emitting display device according to an exemplary embodiment of the inventive concepts will hereinafter be described.

Figure 5:
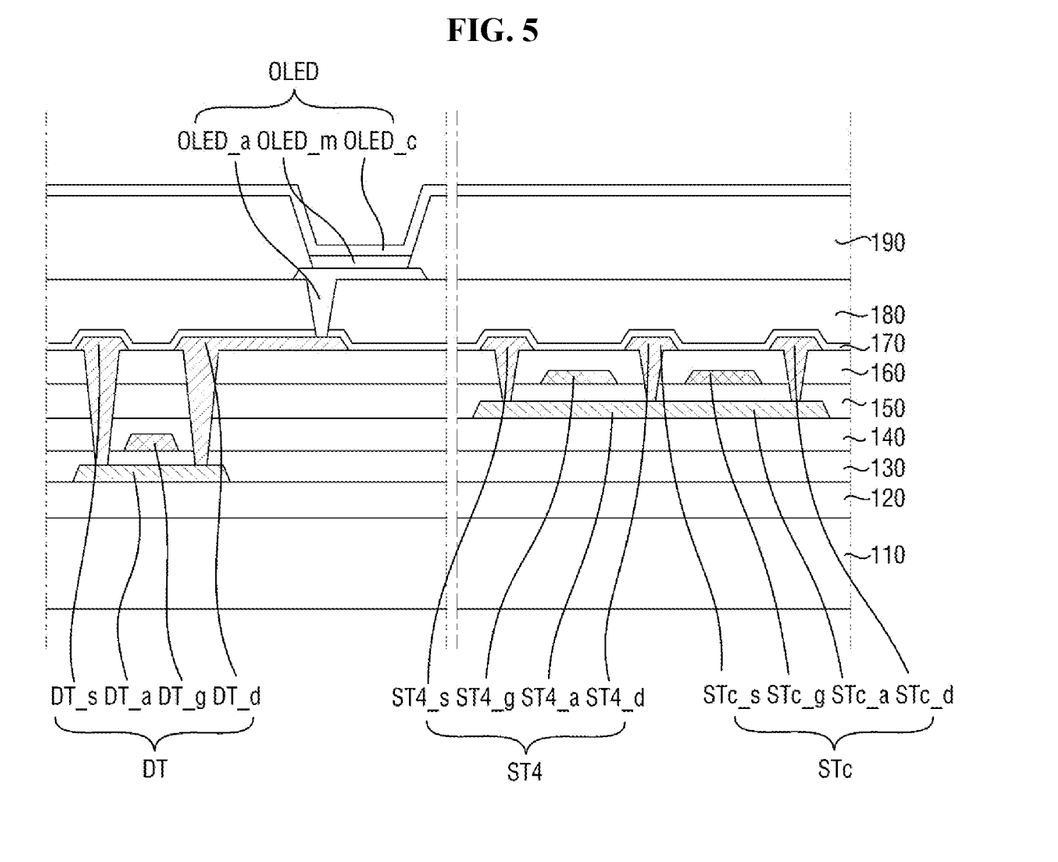
FIG. 5 is a cross-sectional view of the pixel according to an exemplary embodiment of the inventive concepts.

FIG. 5 is a cross-sectional view of the pixel according to an exemplary embodiment of the inventive concepts.

Specifically, FIG. 5 illustrates the cross-sectional structure of the pixel PX of FIG. 2, particularly, a region where the driving transistor DT, the fourth transistor ST4, and the compensation transistor STc of FIG. 2 are disposed. The driving transistor DT will hereinafter be described as being, for example, a polysilicon semiconductor TFT having a top gate structure, and the fourth transistor ST4 and the compensation transistor STc will hereinafter be described as being, for example, oxide semiconductor TFTs having the top gate structure. Alternatively, the driving transistor DT, the fourth transistor ST4, and the compensation transistor STc may be configured to have a bottom gate structure without departing from the scope of the inventive concepts.

Referring to FIG. 5, the region where the driving transistor DT4, the fourth transistor ST4, and the compensation transistor STc are disposed is defined on a substrate 110.

The substrate 110 may be an insulating substrate. The substrate 110 may be a glass substrate, a quartz substrate, a ceramic substrate, or a plastic substrate. Alternatively, the substrate 110 may be a flexible substrate that is bendable, foldable, or rollable. In this case, the substrate 110 may comprise polyimide (PI), but the present disclosure is not limited thereto.

A buffer layer 120, which is formed of silicon oxide or silicon nitride, is disposed on the substrate 110 in order to planarize the top surface of the substrate 110 and prevent the infiltration of impurities into a first semiconductor layer DT_a that will be described later.

The first semiconductor layer DT_a, which is used as the active layer of the driving transistor DT, is disposed on the buffer layer 120. The first semiconductor layer DT_a may be formed by depositing an amorphous silicon layer and then crystallizing the amorphous silicon layer, and then source, drain, and channel regions may be defined through an ion implantation process.

FIG. 5 illustrates an example in which only the driving transistor DT uses the first semiconductor layer DT_a as its active layer, but the inventive concepts are not limited thereto. That is, some of the transistors of the pixel PX may use a semiconductor material layer formed on the same layer as the first semiconductor layer DT_a as their active layers.

A first insulating layer 130 is disposed on the first semiconductor layer DT_a.

The first insulating layer 130 may be formed of an insulating material in order to insulate the first semiconductor layer DT_a from a gate electrode DT_g of the driving transistor DT. For example, the first insulating layer 130 may be formed of an inorganic insulating material, such as silicon oxide and/or silicon nitride, or an organic insulating material, such as an acrylic organic material or benzocyclobutene (BCB).

The gate electrode DT_g of the driving transistor DT is disposed on the first insulating layer 130. A source electrode DT_s and a drain electrode DT_d of the driving transistor DT may be electrically connected depending on a signal applied to the gate electrode DT_g of the driving transistor DT. The gate electrode DT_g of the driving transistor DT may be formed as a single layer or a multilayer using a material such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu) in consideration of the material's adhesion to adjacent layers, the flatness of a surface where the material is to be deposited, or the material's processability.

A second insulating layer 140 is disposed on the gate electrode DT_g of the driving transistor DT. The second insulating layer 140 may be formed of a similar material to the first insulating layer 130 and may perform a similar function to the first insulating layer 130.

Second semiconductor layers ST4_a and STc_a are disposed on the second insulating layer 140. The second semiconductor layers ST4_a and STc_a may serve as the active layers of the fourth transistor ST4 and the compensation transistor STc. The second semiconductor layer ST4_a of the fourth transistor ST4 and the second semiconductor layer STc_a of the compensation transistor STc may be integrally formed.

A third insulating layer 150 is disposed on the second semiconductor layers ST4_a and STc_a. The third insulating layer 150 may be formed of a similar material to the first insulating layer 130 and may perform a similar function to the first insulating layer 130.

A gate electrode ST4_g of the fourth transistor ST4 and a gate electrode STc_g of the compensation transistor STc are disposed on the second insulating layer 150.

A fourth insulating layer 160 is disposed on the gate electrode ST4_g of the fourth transistor ST4 and the gate electrode STc_g of the compensation transistor STc. The fourth insulating layer 160 may be formed of a similar material to the first insulating layer 130 and may perform a similar function to the first insulating layer 130.

The source electrode DT_s and the drain electrode DT_d of the driving transistor DT, a source electrode ST4_s and a drain electrode ST4_d of the fourth transistor ST4, and a source electrode STc_s and a drain electrode STc_d of the compensation transistor STc are disposed on the fourth insulating layer 160. The source electrode DT_s and the drain electrode DT_d of the driving transistor DT, the source electrode ST4_s and the drain electrode ST4_d of the fourth transistor ST4, and the source electrode STc_s and the drain electrode STc_d of the compensation transistor STc may be formed as single layers or multilayers using a material such as Al, Pt, Pd, Ag, Mg, Au, Ni, Nd, Ir, Cr, Li, Ca, Mo, Ti, W, or Cu in consideration of conductivity.

The source electrode DT_s and the drain electrode DT_d of the driving transistor DT may be electrically connected to the first semiconductor layer DT_a via contact holes that penetrate the first, second, third, and fourth insulating layers 130, 140, 150, and 160.

The source electrode ST4_s and the drain electrode ST4_d of the fourth transistor ST4 may be connected to the second semiconductor layer ST4_a of the fourth transistor ST4 via contact holes that penetrate the third and fourth insulating layers 150 and 160.

The source electrode STc_s and the drain electrode STc_d of the compensation transistor STc may be connected to the second semiconductor layer ST4_c of the compensation transistor STc via contact holes that penetrate the third and fourth insulating layers 150 and 160.

Here, the source electrode STc_s and the drain electrode STc_d of the compensation transistor STc may be integrally formed and may thus be electrically connected.

A passivation layer 170 is disposed on the source electrode DT_s and the drain electrode DT_d of the driving transistor DT, the source electrode ST4_s and the drain electrode ST4_d of the fourth transistor ST4, and the source electrode STc_s and the drain electrode STc_d of the compensation transistor STc. The passivation layer 170 may be formed of an inorganic material such as, for example, silicon oxide, silicon nitride, or silicon oxynitride, and may protect the driving transistor DT, the fourth transistor ST4, and the compensation transistor STc.

A planarization layer 180 is disposed on the passivation layer 170. In some exemplary embodiments, the planarization layer 180 may serve as a passivation layer. In a case where the OLED "OLED" is disposed above the driving transistor DT, the fourth transistor ST4, and the compensation transistor STc, the planarization layer 180 may planarize the top surfaces of the driving transistor DT, the fourth transistor ST4, and the compensation transistor STc and may protect various elements. The planarization layer 180 may be formed of, for example, an acrylic organic material or BCB.

A pixel defining film 190 may be disposed on the driving transistor DT, the fourth transistor ST4, and the compensation transistor STc. The pixel defining film 190 may be disposed on the planarization layer 180 and may have an opening. The pixel defining film 190 defines a pixel region in which the pixel PX is disposed on the substrate 110. The pixel defining film 190 may be formed of, for example, an organic insulating material. Examples of the organic insulating material include an acrylic polymer such as polymethyl methacrylate (PMMA), polystyrene (PS), a polymer derivative having a phenol group, an imide polymer, an aryl ether polymer, an amide polymer, a fluorine polymer, a p-xylene polymer, a vinyl alcohol polymer, and a mixture thereof.

The OLED "OLED" may be disposed on the pixel defining film 190. The OLED "OLED" may include an anode electrode OLED_a, a middle layer OLED_m having an emission layer (EML), and a cathode electrode OLED_c.

The anode electrode OLED_a may be formed as a transparent (or translucent) electrode or a reflective electrode. In a case where the anode electrode OLED_a is formed as a transparent (or translucent) electrode, the anode electrode OLED_a may be formed of, for example, indium tin oxide (ITO), indium zinc oxide (IZO), zinc oxide (ZnO), indium oxide ($In_2O_3$), indium gallium oxide (IGO), or Al-doped zinc oxide (AZO), but the inventive concepts are not limited thereto. In a case where the anode electrode OLED_a is formed as a reflective electrode, the anode electrode OLED_a may include a reflective film formed of Ag, Mg, Al, Pt, Pd, Au, Ni, Nd, Ir, Cr or a compound thereof and a layer formed of ITO, IZO, ZnO, In2O3, IGO, or AZO, but the inventive concepts are not limited thereto. The structure and the material of the anode electrode OLED_a are not particularly limited, and various modifications can be made thereto. That is, the anode electrode OLED_a may be formed of various materials other than those set forth herein and may have a single- or multi-layer structure.

In the pixel region defined by the pixel defining film 190, the middle layer OLED_m may be disposed. The middle layer OLED_m includes the EML, which emits light in accordance with an electric signal, and further includes a hole injection layer (HIL) and a hole transport layer (HTL), which are disposed between the EML and the anode electrode OLED_a and are formed to have a single- or multi-layer structure, and an electron transport layer (ETL) and an electron injection layer (EIL), which are disposed between the EML and the cathode electrode OLED_c and are formed to have a single- or multi-layer structure. However, the structure of the middle layer OLED_m is not particularly limited, and the middle layer OLED_m may have various structures other than that set forth herein.

The cathode electrode OLED_c, which covers the middle layer OLED_m including the EML and faces the anode electrode OLED_a, may be disposed on the entire surface of the substrate 110. The cathode electrode OLED_c may be formed as a transparent (translucent) electrode or a reflective electrode.

In a case where the cathode electrode OLED_c is formed as a transparent (translucent) electrode, the cathode electrode OLED_c includes a layer formed of a metal with a low work function such as Li, Ca, LiF/Ca, LiF/Al, Al, Ag, Mg, or a compound thereof and a transparent (or translucent) conductive layer formed of ITO, IZO, ZnO, or $In_2O_3$. In a case where the cathode electrode OLED_c is formed as a reflective electrode, the cathode electrode OLED_c may include a layer formed of Li, Ca, LiF/Ca, LiF/Al, Al, Ag, Mg, or a compound thereof. However, the structure and the material of the cathode electrode OLED_c are not particularly limited, and various modifications can be made thereto. The electrode disposed below the middle layer OLED_m is illustrated as being the anode electrode OLED_a, and the electrode disposed above the middle layer OLED_m is illustrated as being the cathode electrode OLED_c. Alternatively, the electrode disposed below the middle layer OLED_m may be the cathode electrode OLED_c, and the electrode disposed above the middle layer OLED_m may be the anode electrode OLED_a.

A thin film encapsulation layer (not illustrated) may be disposed on the cathode electrode OLED_c. The thin film encapsulation layer may have a multilayer structure in which at least one organic film and at least one inorganic film are alternately stacked.

Figure 6:
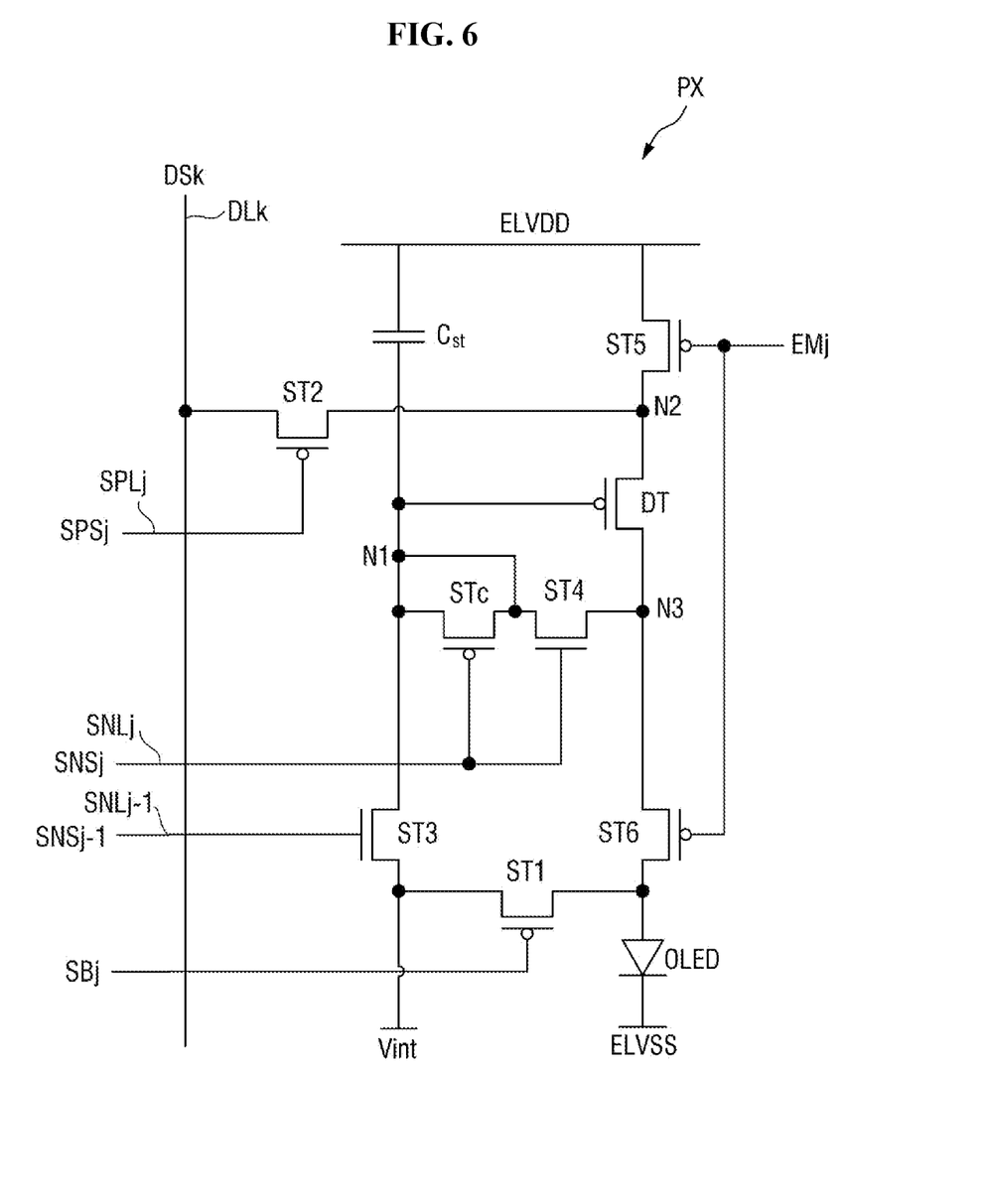
FIG. 6 is an equivalent circuit diagram of a pixel according to another exemplary embodiment of the inventive concepts.

FIG. 6 is an equivalent circuit diagram of a pixel according to another exemplary embodiment of the inventive concepts.

Detailed descriptions of elements and reference numerals that have already been described above with reference to FIGS. 1 through 5 will be omitted.

Referring to FIG. 6, a pixel PX includes a driving transistor DT, an OLED "OLED", a control circuit, and a capacitor C. The control circuit includes first through sixth transistors ST1 through ST6 and a compensation transistor STc.

In the exemplary embodiment of FIGS. 1 through 5, unlike in the exemplary embodiment of FIG. 6, the compensation transistor STc may be a P-type transistor. Accordingly, a control electrode of the compensation transistor STc may be connected to a j-th inverted scan line SNLj and may be provided with a j-th inverted scan signal SNSj.

Thus, the compensation transistor STc may be turned on when the fourth transistor ST4 is turned off, and may be turned off when the fourth transistor ST4 is turned on.

It will be apparent to those skilled in the art that various modifications and variations can be made in the disclosed embodiments without departing from the spirit and scope of the inventive concepts. Thus, it is intended that the inventive concepts cover the modifications and variations of the disclosed embodiments provided they come within the scope of the appended claims and their equivalents.

What is claimed is:

1. An organic light-emitting display device comprising a plurality of pixels, wherein each of the pixels comprises:
   an organic light-emitting diode (OLED);
   a driving transistor having a control electrode connected to a first node, an input electrode connected to a second node, and an output electrode connected to a third node the driving transistor being configured to provide a driving current to the OLED;
   a sustain capacitor connected to the first node;
   a first transistor configured to control whether the first and third nodes are to be connected; and
   a compensation transistor having both an input electrode and an output electrode directly connected to the first node.

2. The organic light-emitting display device of claim 1, wherein the compensation transistor is turned on by a scan signal and the first transistor is turned on by an inverted scan signal.

3. The organic light-emitting display device of claim 1, wherein the driving transistor and the first transistor are of different types.

4. The organic light-emitting display device of claim 3, wherein the first transistor and the compensation transistor are of the same type.

5. The organic light-emitting display device of claim 4, wherein an active layer of the first transistor and an active layer of the compensation transistor share the same semiconductor layer.

6. The organic light-emitting display device of claim 1, wherein the driving transistor is a P-type transistor and the first transistor is an N-type transistor.

7. The organic light-emitting display device of claim 6, wherein the compensation transistor is a P-type transistor.

8. The organic light-emitting display device of claim 7, wherein a control electrode of the first transistor and a control electrode of the compensation transistor are provided with the same signal.

9. The organic light-emitting display device of claim 6, wherein:
   the driving transistor includes a first semiconductor layer: and
   the first transistor includes a second semiconductor layer disposed on a different level from the first semiconductor layer.

10. The organic light-emitting display device of claim 9, wherein the first semiconductor layer is formed of at least one selected from among amorphous silicon, polysilicon, and low-temperature polysilicon (LTPS).

11. The organic light-emitting display device of claim 10, wherein the second semiconductor layer is formed of an oxide semiconductor.

12. The organic light-emitting display device of claim 1, wherein the compensation transistor is an N-type transistor.

13. The organic light-emitting display device of claim 12, wherein a control signal for the first transistor and a control signal for the compensation transistor have opposite phases.

14. The organic light-emitting display device of claim 1, wherein each of the pixels further comprises a second transistor configured to control whether to provide a data signal to the second node.

15. An organic light-emitting display device comprising:
   a substrate;
   a buffer layer disposed on the substrate;
   a first semiconductor layer disposed on the buffer layer;
   a first insulating layer disposed on the first semiconductor layer and the buffer layer;
   a second insulating layer disposed on the first insulating layer;
   a second semiconductor layer disposed on the second insulating layer;
   a third insulating layer disposed on the second semiconductor layer and the second insulating layer;
   a fourth insulating layer disposed on the third insulating layer;
   a passivation layer disposed on the fourth insulating layer;
   a planarization layer disposed on the passivation layer;
   a plurality of OLEDs disposed on the planarization layer
   a pixel defining layer disposed on the planarization layer, the pixel defining layer defining a plurality of pixels, each pixel containing one of the plurality of OLEDs,
   wherein:
   an active layer of a driving transistor, in which the driving transistor is configured to provide a driving current to the OLED, is the first semiconductor layer;
   an active layer of a first transistor, in which the first transistor is directly connected to an output electrode and a control electrode of the driving transistor, is the second semiconductor layer; and
   an active layer of a compensation transistor, in which the compensation transistor has both an input electrode and an output electrode connected to a control electrode of the driving transistor, is the second semiconductor layer.

16. The organic light-emitting display device of claim 15, wherein the driving transistor and the first transistor are of different types.

17. The organic light-emitting display device of claim 16, wherein the first transistor and the compensation transistor are of the same type.

18. The organic light-emitting display device of claim 17, wherein a control signal for the first transistor and a control signal for the compensation transistor have opposite phases.

19. The organic light-emitting display device of claim 15, wherein:
- the first semiconductor layer is formed of at least one of amorphous silicon, polysilicon, and LTPS; and
- the second semiconductor layer is formed of an oxide semiconductor.

20. The organic light-emitting display device of claim 15, further comprising a second transistor configured to control whether to provide a data signal to the driving transistor.

* * * * *